United States Patent [19]

Rudolf et al.

[11] Patent Number: 5,090,900
[45] Date of Patent: Feb. 25, 1992

[54] WORKPIECE SUPPORT FOR VACUUM CHAMBER

[75] Inventors: Wagner Rudolf, Fontnas, Switzerland; Martin Bader; Eberhard Moll; Renzo Zanardo, all of Liechtenstein, Fed. Rep. of Germany; J. G. Van Agtmaal, Hilversum, Netherlands

[73] Assignee: Balzers Aktiengesellschaft, Balzers, Liechtenstein, Liechtenstein

[21] Appl. No.: 577,462

[22] Filed: Sep. 4, 1990

Related U.S. Application Data

[62] Division of Ser. No. 356,872, May 24, 1989, Pat. No. 4,990,047.

[30] Foreign Application Priority Data

May 24, 1988 [CH] Switzerland ............ 01951/88
Jul. 7, 1988 [CH] Switzerland ............ 2722/88

[51] Int. Cl.[5] .................. F27D 5/00; B65G 53/18; C23C 16/00
[52] U.S. Cl. .................. 432/239; 432/253; 406/88; 118/728
[58] Field of Search .......... 432/58, 239, 253, 258; 414/676, 609; 406/86, 88, 73; 118/728

[56] References Cited

U.S. PATENT DOCUMENTS

| | | | |
|---|---|---|---|
| 3,930,684 | 1/1976 | Lasch, Jr. et al. | 406/88 X |
| 4,603,466 | 8/1986 | Morley . | |
| 4,667,076 | 5/1987 | Amada | 118/728 X |
| 4,690,591 | 9/1987 | Nagashima et al. | 406/88 |
| 4,874,273 | 10/1989 | Tokisue et al. | 406/86 X |
| 4,903,754 | 2/1990 | Hirscher et al. | 118/728 X |

FOREIGN PATENT DOCUMENTS

| | | |
|---|---|---|
| 0165400 | 4/1985 | European Pat. Off. . |
| 3633386A1 | 4/1988 | Fed. Rep. of Germany . |

*Primary Examiner*—Henry A. Bennett
*Assistant Examiner*—Christopher B. Kilner
*Attorney, Agent, or Firm*—Notaro & Michalos

[57] ABSTRACT

A workpiece support for supporting a disc-shaped workpiece in a vacuum chamber, comprises a support member with a support surface for carrying the workpiece. A plurality of bores extend from the support surface and through the support member. The bores communicate with a distribution chamber defined on a side of the support member which is opposite from the support surface. The distribution chamber is substantially co-extensive with the support surface and is connected to a gas feed line for supplying gas to the distribution chamber. The bores each have respective diameters which are substantially shorter than their respective lengths through the support member. In this way, gas supplied through the bores from the distribution chamber is distributed between the support surface and the workpiece as a heat transfer medium which is substantially independent from the gas flow at an inlet of each bore in the distribution chamber.

15 Claims, 7 Drawing Sheets

WORKPIECE SUPPORT FOR VACUUM CHAMBER

This application is a division of application Ser. No. 07/356,872, filed May 24, 1989 now U.S. Pat. No. 4,990,047.

BACKGROUND OF THE INVENTION

1. Field of the invention

The present invention relates to a vacuum apparatus for the treatment of workpieces and having at least one treating chamber for said workpieces and a central evacuable distribution chamber and including a first transporting mechanism and locks through which the workpieces can be placed by the first transporting mechanism into the distribution chamber and retrieved by same after having been treated.

2. Description of the prior art

In the periodical Solid State Technology of October 1987 (pages 55/56) such a multi-chamber apparatus for the treating of silicon wafers is known which includes a robot arm located in a central distributing chamber and which places the individual semi-conductor disks in accordance with a set programme into the individual treatment chambers and retrieves these disks out of such chambers after having received a certain treatment such as a coating. A plurality of treatment chambers may be connected to one such central distribution chamber whereby the semi-conductor disks can be transported through the distribution chamber from one treatment chamber into another treatment chamber such that they must not be transported in the free environment between the individual treatments. In case of extremely delicate treatments there is, however, a danger that residual gases which e.g. are necessary for a treatment step in one treatment chamber could reach another treatment chamber where they disturb the treatment being made there or it is possible, that particles which possibly were raised during the one or the other treatment step are dragged along. It is also possible that particles which together with not yet treated semi-conductor wafers are brought from the outer chamber into the distribution chamber and then settle onto already treated semiconductor disks when moving across and detrimentally influence the following treatments to be made with these not as yet treated semi-conductor disks.

It already has been proposed to decoupage the individual treatment steps by pressure step locks which are out in the circuit ahead of the treatment chambers e.g. by means of a so called pressure step system which consists of three vacuum chambers which can be evacuated separately and where the wafers are transported through corresponding slots in the walls between the individual chambers into the treatment chambers. The main object of the pressure step locks was thereby only to maintain a differential pressure between the individual chambers of the vacuum system.

SUMMARY OF THE INVENTION

It is an object of the present invention to provide a vacuum apparatus having a plurality of treatment chambers in which the above mentioned dragging along of residual gases and particles from one treatment chamber into the other treatment chamber or one workpiece onto the other is reduced to a minimum or is excluded entirely.

A further object is to provide a vacuum apparatus which comprises an evacuable intermediate chamber including communication openings and thereto allocated shut-off members located between the distribution chamber and at least one treatment chamber and including communication openings and allocated shut-off members in correlation with the distribution chamber and the treatment chamber and comprising a further transporting mechanism operative to transport the workpieces into the treatment chamber.

Yet a further object is to provide a vacuum apparatus in which a plurality of intermediate chambers and thereto allocated treatment chambers are connected to one distribution chamber and/or a plurality of treatment chambers are allocated to one intermediate chamber.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
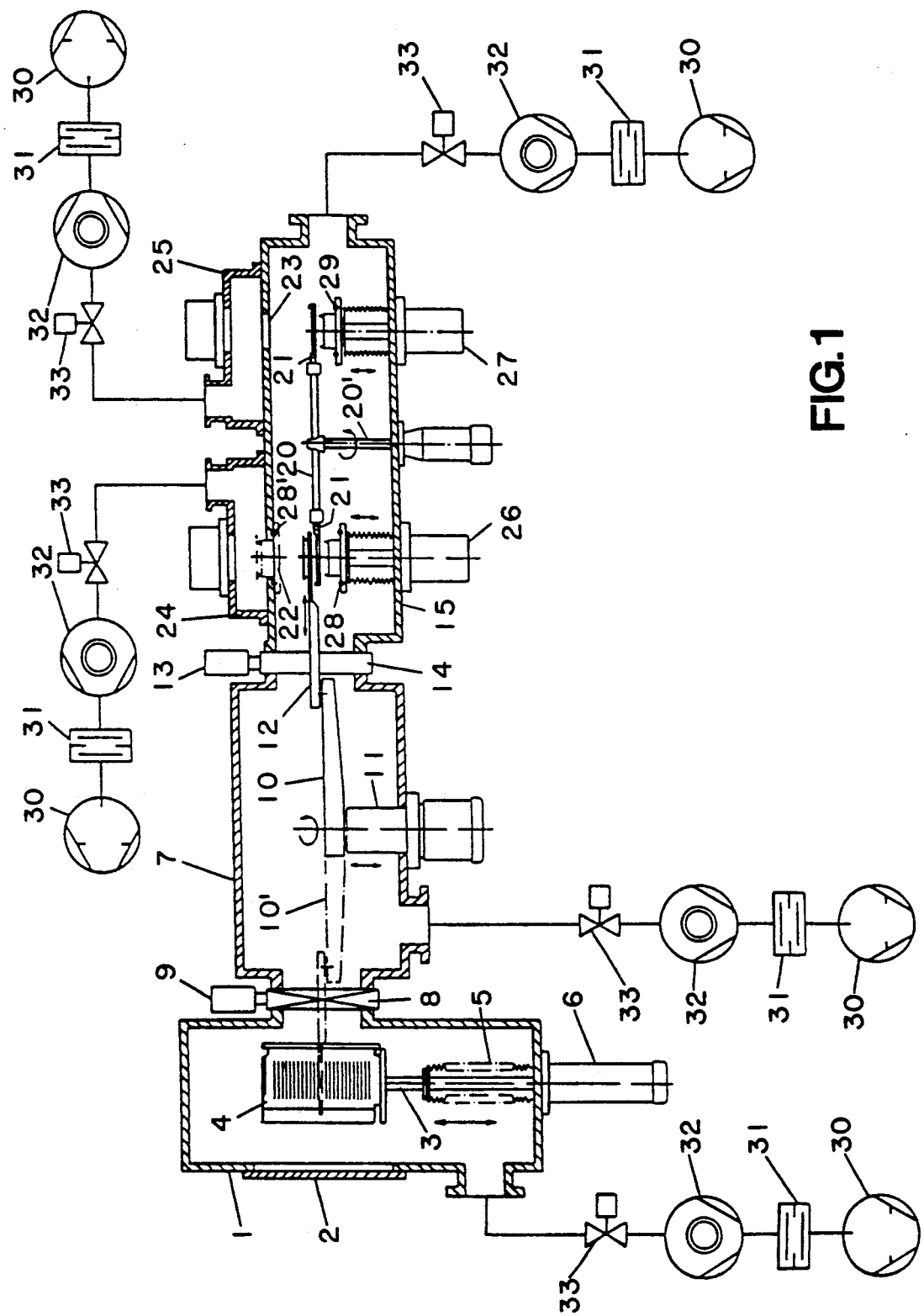
FIG. 1 is a schematic view of a vertical section through a vacuum apparatus.

FIG. 1 illustrates a lock chamber 1 forming an input chamber and having a door 2 leading to the free environment and having a mounting support 3 for a wafer magazine 4 located in said chamber 1. The magazine 4 can be raised and lowered by means of an elevating mechanism having a siphon gland 5 and an operating mechanism 6 such that at a given instance one certain disk of the magazine 4 to be treated is located at a suitable height or level for introduction into a distributing chamber 7 through the opening of the gate 8; latter is opened or closed as the need arises by an actuator unit 9.

A first transport mechanism 10, 11 for a transporting of the respective disk retrieved from the magazine on to the intermediate chamber 15 is located in the distributing mechanism includes a rotatably mounted robot arm 10 to which a controllable drive 11 is allocated. In operation the robot arm 10 retrieves by means of the disk support 12 and by the gate 8 in its open position one respective disk from the magazine 4 and forwards the disk through the open gate 14 which is operated by an auxiliary unit 13 into the intermediate chamber 15. In case of a plurality of intermediate chambers the disk is forwarded into such intermediate chamber which corresponds to the treatment operating programme.

The position of the rotatable robot arm 10 in which it retrieves a disk from the magazine 4 is illustrated in FIG. 1 by broken lines 10. Its position in which it passes the disk on to the intermediate chamber 15 whereby the gate 14 is open is identified by 10 in full lines. A second mechanism for the handling of the disks is located in the intermediate chamber 15 from which the forwarding of the disks to the individual treatment chambers 24 and 25 connected thereto is made, in which chambers the disks are subjected to their further treatment steps, e.g. a coating or etching during a treatment procedure of the production.

This second transport mechanism is designed similar to the first one as a rotating arm 20 having gripping devices 21 for a taking over of the disks brought by the first mechanism. By means of a corresponding rotating of the gripping devices 21 along a circular path the disks can be brought under the openings 22 and 23 located on a circle to the treatment chambers 24 and 25 and can be raised by means of elevating mechanisms 26 and 27 (which can be designed similar to those in the lock chamber 1) up to the treatment locations of the individual treatment chambers and lowered, after the treatment and be forwarded to a further treatment station. The elevating mechanisms of the illustrated embodiment are additionally equipped with annular seals 28 and 29 which upon getting fitted at the cover of the intermediate chambers provide for a vacuum tight seal around the openings 22 and 23 and between the intermediate chamber and the treatment chambers; the shut off position of the seal 28 is illustrated in FIG. 1 by 28'.

FIG. 1 illustrates further schematically the pumping units allocated to the various chambers and of which each can consist e.g. of a backing pump 30, a condenser 31, a high vacuum pump 32 and a valve 33. All gates and valves and the pumps can be connected to a control mechanism or control computer, so as to acuate them for corresponding to the desired treating or production cycle (which is not a subject of the present invention).

In FIG. 1 only one simplyfied arrangement having only one intermediate chamber 15 connected to the chamber 7 is shown, it is, however, obvious for the person skilled in the art that also two or more intermediate chambers can be connected to the distribution chamber from which the disks can be distributed in accordance with a pre-set programme by the second mechanism to the treatment chambers connected to the intermediate chambers.

Figure 2:
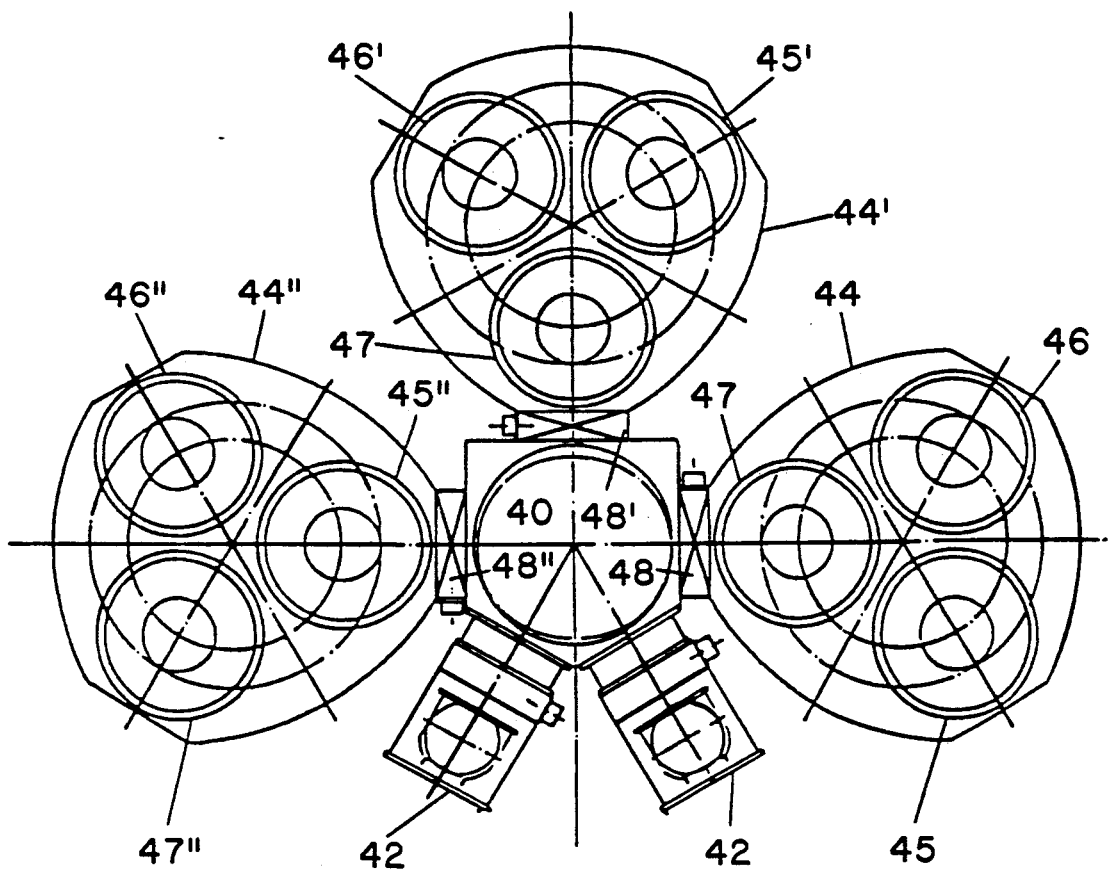
FIG. 2 is a schematic top view of a vacuum apparatus having three intermediate chambers and nine treatment chambers.

The pattern of such an arrangement is illustrated in FIG. 2. The reference numeral 40 denotes the central distributing chamber having at least three ports and into which the disks to be treated are fed and from which they are retreived after the treatment from and to workpiece input and output chambers 42, 42. The intermediate chambers 44, 44' and 44" are connected at three sides to this central distributing chamber and in the illustrated embodiment three treatment chambers are connected to every intermediate chamber, which treatment chambers are identified in FIG. 2 schematically by 45, 46 and 47; 45', 46', 47' and 45", 46", 47". The communication between the distributing chamber and the intermediate chambers connected thereto is given by the gates 48, 48' and 48" which are opened and closed by an actuating unit in accordance with the processing treatments to be made. The above mentioned (not illustrated in FIG. 2) first and second mechanisms are located in the central distributing chamber or in the intermediate chambers which are flanged thereonto; these conduit the transporting of the disks in accordance with the processing sequence into the individual chambers or out of these chambers, similar to the procedure described in connection with FIG. 1.

Figure 3:
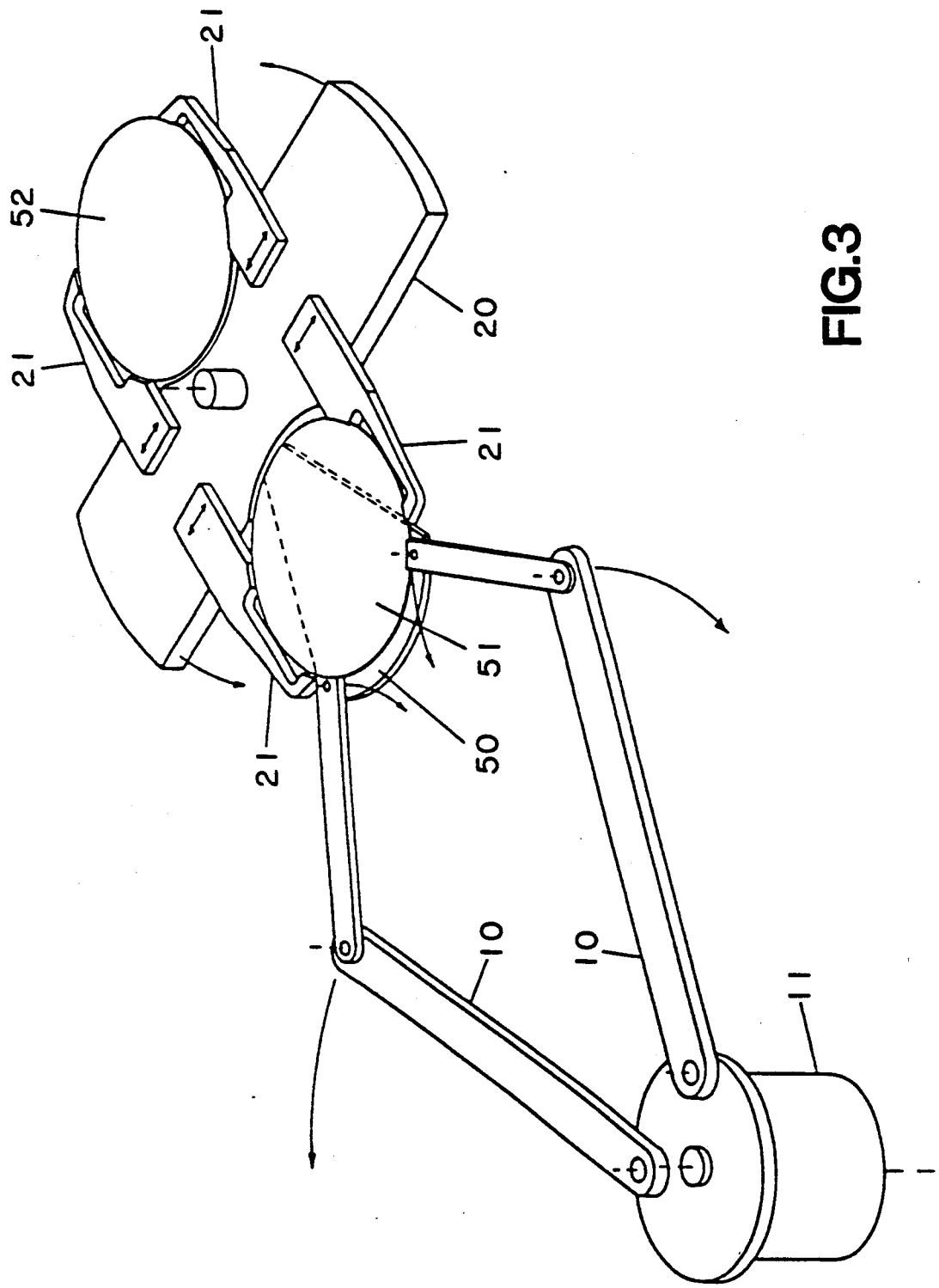
FIG. 3 is a perspective illustration of the principle of the transferring of a disk from the first to the second transporting mechanism.

FIG. 3 illustrates the first and second mechanisms used in the embodiment of FIG. 1 and their interaction. The reference numerals, as far as used, are the same as those of FIG. 1. A plate 50 is mounted such to the robot arm 10 and controlled by the drive 11, so that the plate can reach under a disk and take it from the cassette in the lock chamber 1 and pass it on after a retreating and rotating of the robot arm from the position 10' into the position 10 (see FIG. 1) to the gripping devices 21 in the chamber 15. By means of the second mechanism the disks will thereafter be brought into the proper position opposite the opening of a treatment chamber in that it rotates around the axis 20'. The apparatus according to FIG. 1 is designed such that the corresponding disk is positioned already after the passing on to the second mechanism in this position opposite of the treatment chamber 24. In the illustration according to FIG. 3 a disk 51 located on the plate is just passed on to the gripping device 21 (and thus would be positioned under the opening 22 of FIG. 1), whereas a further disk 52 is illustrated under the opening 23 of the treatment chamber 25 rotated further (in case of a treble division rotated further by 120°).

The inventive method for operating the vacuum apparatus will now be explained based on FIG. 1 and is characterized in that the first transporting mechanism 10, 11, 12 located in the first distributing chamber 7 takes consecutively one workpiece out of a magazine 4 in the lock 1 and transports it along the course through the distributing chamber 7 into an intermediate chamber 15 and in that the second transporting mechanism 20, 21 located in the intermediate chamber takes the workpiece over from the first transporting mechanism 10, 11, 12 and keeps it ready in a position coaxial to a communication opening 22 or 23 between the intermediate chamber 15 and one of the treatment chambers 24 or 25. This method of operation is specifically characterized in case of a plurality of treatment chambers 24, 25 allocated to one intermediate chamber 15 and of elevating mechanisms 26, 27 for a raising and lowering transport of the disks into and out of the treatment chambers in which elevating mechanisms 26, 27 are located below the communication openings 22, 23 between the treatment chambers 24, 25 and the intermediate chamber 15 and in the intermediate chamber 15, in accordance with the invention in that the second transport mechanism 20, 21 places the workpiece which has been taken over from the first transport mechanism 10, 11, 12 onto one of the elevating mechanisms 26, 27 which transports the workpiece into a treatment chamber 24, 25 located above the elevating mechanisms 24, 25, and in that the workpiece is transported along the same path at a reversed sequence of the transporting steps back to its starting position.

The method of operating the vacuum apparatus can specifically be formed such that in case of at least two treatment chambers 24, 25 allocated to one respective intermediate chamber 15 each one of these treatment chambers is placed into operation and regenerated during consecutively following time intervals alternatively after being loaded whereby during the regeneration of one treatment chamber the further chamber is placed into operation. In other words it can be stated that for each treatment chamber a certain time span during which a disk is treated in this chamber is followed by a time span during which this chamber is regenerated. In case of two treatment chambers being present such can be carried out alternately such that the regenerating phase and the treatment phase are interchanged continuously.

In case of a plurality of treatment chambers 24,25 and in view of increasing the throughput, it is of course possible to carry out parallel treatments (parallel processes).

Finally, the method of operating the vacuum apparatus can be designed in accordance with the Invention also such that instead of an elevating mechanism 26 or 27 a magazine having a supply of disks is located in an intermediate chamber and that then an intermediate chamber with a plurality for instance three treatment chambers allocated thereto is put into operation as a unit which is functionable independently from the rest of the vacuum apparatus, in other words a unit which can operate autonomously if for instance the other parts of the vacuum apparatus are out of operation due to an operational break-down.

It already has been mentioned above that the vacuum apparatus comprises elevating mechanisms located in every intermediate chamber present, which are operative to bring a disk placed onto the elevating mechanism into a treatment chamber located above the intermediate chamber. During this procedure the disk shaped workpiece must be secured to the support of the elevating mechanism, i.e. the workpiece must be held at its edge such that it maintains a predetermined position.

It is known to use, in order to arrest the workpiece, for instance having the shape of a disk, gripper-like leaf springs which grip around the edge of the disk. These arresting units can be operated into an open and into a closed condition in which they keep the disk arrested. This gives, however, rise to the difficulty that these arresting devices in the treatment chamber are also exposed to the treatment made at the disk. Such treatment is for instance a coating of 1μ aluminum for each disk at a through-put of one disk per minute. As a consequence within five days and aluminum coating of more than 7 millimeters thickness will grow on these arresting or holding devices. It is possible that lumps of aluminum are produced which can hang over and lead often to undesirable shadings during a coating of a disk. It also may happen that the disks grow together with such holding devices and adhere to these devices. If the treatment, on the other hand is an etching process the holding devices are etched too and the material which is removed from the disks could thereby soil the surface of the disk. During a cleaning etching of the disk by a cathode atomization the holding devices cause also distortions of the potential and as a consequence thereof often a kind of a halo or shade.

In many cases the disk to be treated should be positioned on the support of the elevating mechanism further at a predetermined orientation of its position before the disk is transported into the treatment chamber. For the treatment of semiconductor disks for the production of integrated micro-electronic blocks the disk has for instance a contour which differs from the shape of a circle whereby a segment of the circle is cut off which serves for an indicating of the orientation of the crystals and the support for the disk has the same contour which differs from the shape of a circle and the disk must be held and transported precisely oriented relative to the support.

For the vacuum apparatus of the kind mentioned above an elevating mechanism is thus necessary in the shape of a specific elevating table with holding devices which are in a position to bring the workpiece onto the support in an exactly oriented position and lock the workpiece during its transport and without they themselves being exposed during the treatment of the workpiece to the influences of this treatment.

The elevating table to be used in the vacuum apparatus should, furthermore enable a treatment of the workpiece in the treatment chamber at predetermined set temperatures which must be held precisely constant. To this end a supplying of heat against the lower surface of the workpiece or a cooling thereof may be needed.

In order to solve the first object of a position oriented placing of the workpiece onto a support and of a securing of the transport into the treatment chamber an elevating table serves for the rising and lowering transport of a disk shaped workpiece which has a movable workpiece support at which holding members are arranged pivotally to pivot into a holding position and out of such holding position, to move them shortly before the movable support reaches a treatment position into the release position and to move them in this position during the rest of the transport movement of the support into the treatment station until it moves behind a cover which protects the holding devices from the influences of the treatment of the workpiece.

In order to solve this further object the workpiece support is provided with a heating plate which is heatable by a heating element and with a plurality of channels opening at the surface of the support and which are jointly connected to a gas supply line in order to generate between support and workpiece a gas cushion as a homogenous heat conducting means for a heating of the workpiece. The gas cushion serves for an absolutely equal heat distribution under the workpiece. In order to prevent the workpiece from lifting off due to the gas cushion a dead weight load in the form of a loose ring is used which comes to lie at the outer edge of the workpiece in the treatment station. This ring has, furthermore, the duty to keep the annular gap between the support which carries the workpiece and the cover closed. To this end it is also possible to obviously use also a ring which rests only on the edge of the support but not on the edge of the workpiece such that the latter can also be transported in a freely resting condition. By means of this it is possible to treat with the same apparatus either a freely resting workpiece or a workpiece secured at its edge, depending on the prevailing kind of necessary treatment. The ring rests preferably along the entire edge of the workpiece if a sealing action for the gas cushion is to be reached between the workpiece and the support. In this case the ring can be mounted by a spring bellows gas tight to the housing of the vacuum apparatus whereby also the elastic action of the spring bellows can be utilized to counteract the pressure of the gas cushion. If, however, the workpiece must be treated up to the outermost edge the ring can rest also by hooks located at its inner edge on the edge of the workpiece such that, except for the areas of the hooks, the largest part of the edge of the workpiece is heated.

The elevating table with the holding members which can be pivoted into a holding condition and out of the holding condition has the advantage that the holding members protected in the position away from the holding position behind the cover can not get bonded or attached to the workpiece by the influences of the treatment. If, however, the workpiece gets bonded to the ring resting on the edge of the workpiece the pivotable holding members operate in their position pivoted inwards toward the workpiece to separate during the reverse movement of the elevating table into its starting position, the workpiece by tearing the ring off.

Figure 4:
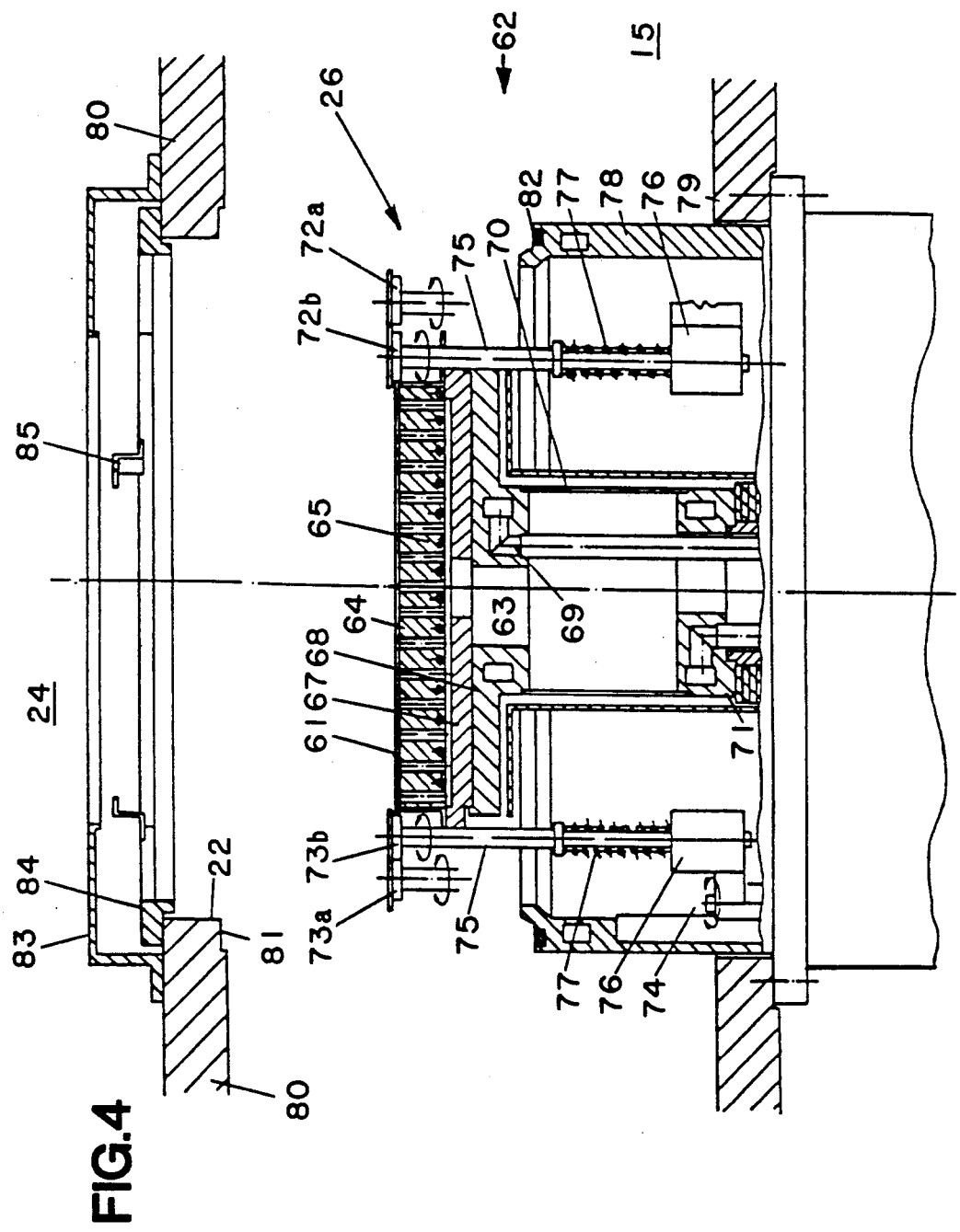
FIG. 4 is a schematic view of a vertical section through an elevating table located in an intermediate chamber and including a mounting device for the disk, illustrated in a first elevating position.

FIG. 4 illustrates the most important parts of one of the elevating mechanisms 26 and 27 illustrated in FIG. 1 and which are designed respectively as elevating table for a rising and lowering movement of a workpiece inside of an intermediate chamber 15. The elevating table 26 is illustrated in FIG. 4 in the so-called loading position in which a disk shaped workpiece 61 is placed on a workpiece support 62 consisting of several parts and specifically onto the central part 63 which in the illustrated example is provided with a heating plate 64 which is heated by a heating element and which heating plate has a plurality of vertical through bores through which a gas can flow in between the disk shaped workpiece 61 and the upper support surface of the heating plate or support member 64. The heating element can heat the heating plate up to a temperatures over 500° C. and the heated gas acts then as heat conducting medium in order to completely evenly heat the workpiece over its entire surface. Use is made here preferably of the same gas which is used by a treatment made in the vacuum apparatus because a gas tight seal at the edge of the heating plate can be achieved only with large difficulties.

A flange 67 located under the heating plate 64 is used for the mounting of the heating element 65 and defining a distribution chamber 164 for the gas supply to the through bores 165 in the heating plate. Bores 165 are preferably distributed evenly over the upper support surface of the support member 64, with the diameter of each bore, as shown in FIG. 4, being substantially shorter than the length of each bore from the distribution chamber 164 to the upper surface of the support member 64. The bores also have equal diameters and equal lengths to each other, with the bores extending vertically with respect to the horizontal upper surface of support member 64 and the horizontally extending distribution chamber 164. This heating plate and the flange 67 are mounted together onto a further flange 68 which contains channels 69 of a rapid cooling system. The flange 68 is mounted gas tight by means of a thin walled tube 70 in a temperature insulated fashion to an also cooled and electrically insulated mounted part 71.

Figure 7:
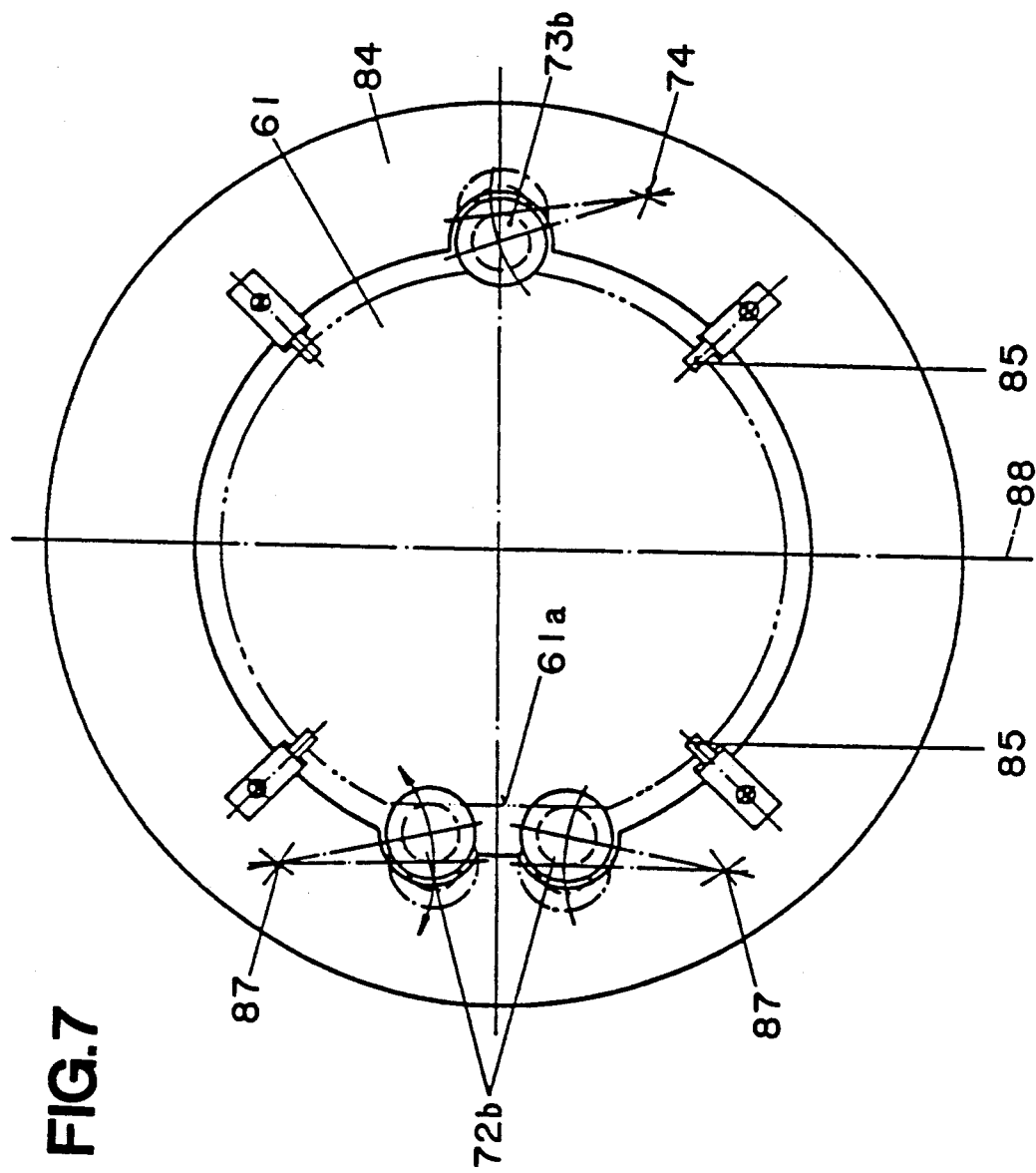
FIG. 7 is a top view of structural members belonging to the elevating table.

The workpiece support 62 which can be moved upwards and downwards includes also mounting members 72 and 73 mounted pivotably thereto. FIG. 7 discloses that two of such mounting members 72 are present at the one side and one mounting member 73 is present at the opposite side. After the workpiece has been placed onto the support 62 the mounting members are pivoted from a position 72a and 73a in which position they are remote from an workpiece engaging position into the position 72b and 73b in which position they are in a engaging position. To this end they are pivoted around an axis 74 extending parallel to the center axis of the workpiece support 62. If necessary a correction of the position of the workpiece 62 on its support is made during this movement, which will be explained in detail later based on FIG. 7. The mounting members 72 and 73 consist each of a rod shaped body 75 which is supported in a bearing 76 for rotation around its axis. Each mounting member can be pressed downwards against the action of a pressure spring 77 supported on the bearing and surrounding the rod shaped body 75.

A cylindrically shaped outer member 78 belongs also to the workpiece support 62 which can be moved upwards and downwards and within which the mounting members 72 and 73 are arranged for a pivotal movement. Such as is disclosed in FIG. 1 the elevating table 26 extends from below through a recess in the wall 79 of the intermediate chamber 15 and this elevating table is flanged at the lower side onto this wall 79. According to FIGS. 1 and 4 a treatment chamber 24 is located above the intermediate chamber 15 which two chambers communicate via a communicating opening 22 in the wall 80 located therebetween. Against an area formed at this wall 80 at the edge of the opening 22 and shaped as valve seat 81 the upper edge of the cylinder shaped outer member 78 with a seal 82 is moved into a sealed contact when the elevating table 26 has risen in order to treat a workpiece 61 inside of the treatment chamber 24. The elevating table 26 acts, therefore, not only for a rising and lowering transport of the workpieces but forms at the same instance a seal which separates the intermediate chamber 15 from the process chamber in a gas tight manner.

According to FIG. 4 an annular cover 83 is mounted to the wall 80 of the chamber and inside of the treatment chamber. Under this cover a loose ring 84 rests on the edge of the wall of the chamber and is guided in the opening 22. At its inner edge this ring 84 has hooks 85 distributed along its circumference.

Figure 5:
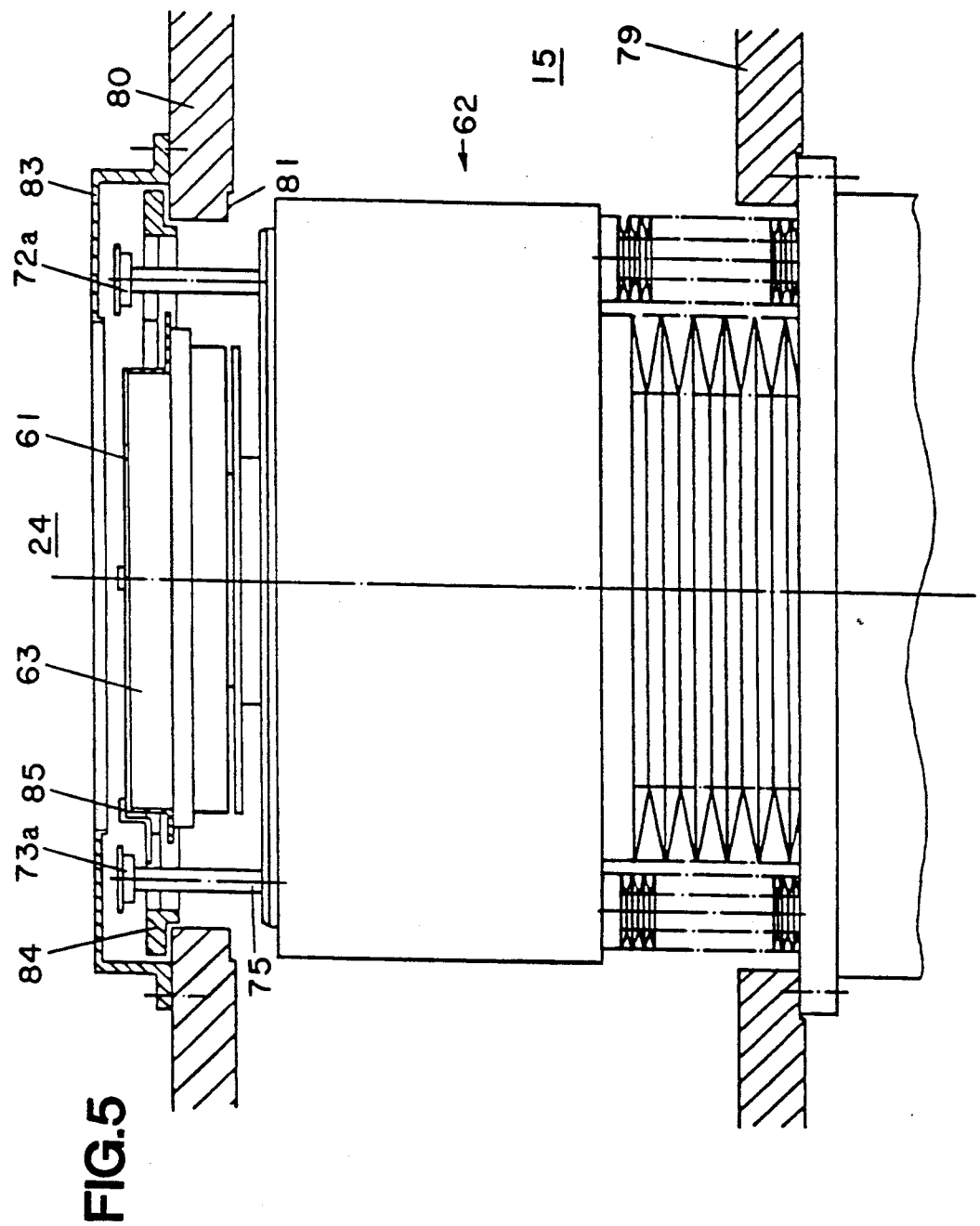
FIG. 5 illustrates the elevating table of FIG. 4 in an intermediate position.
Figure 6:
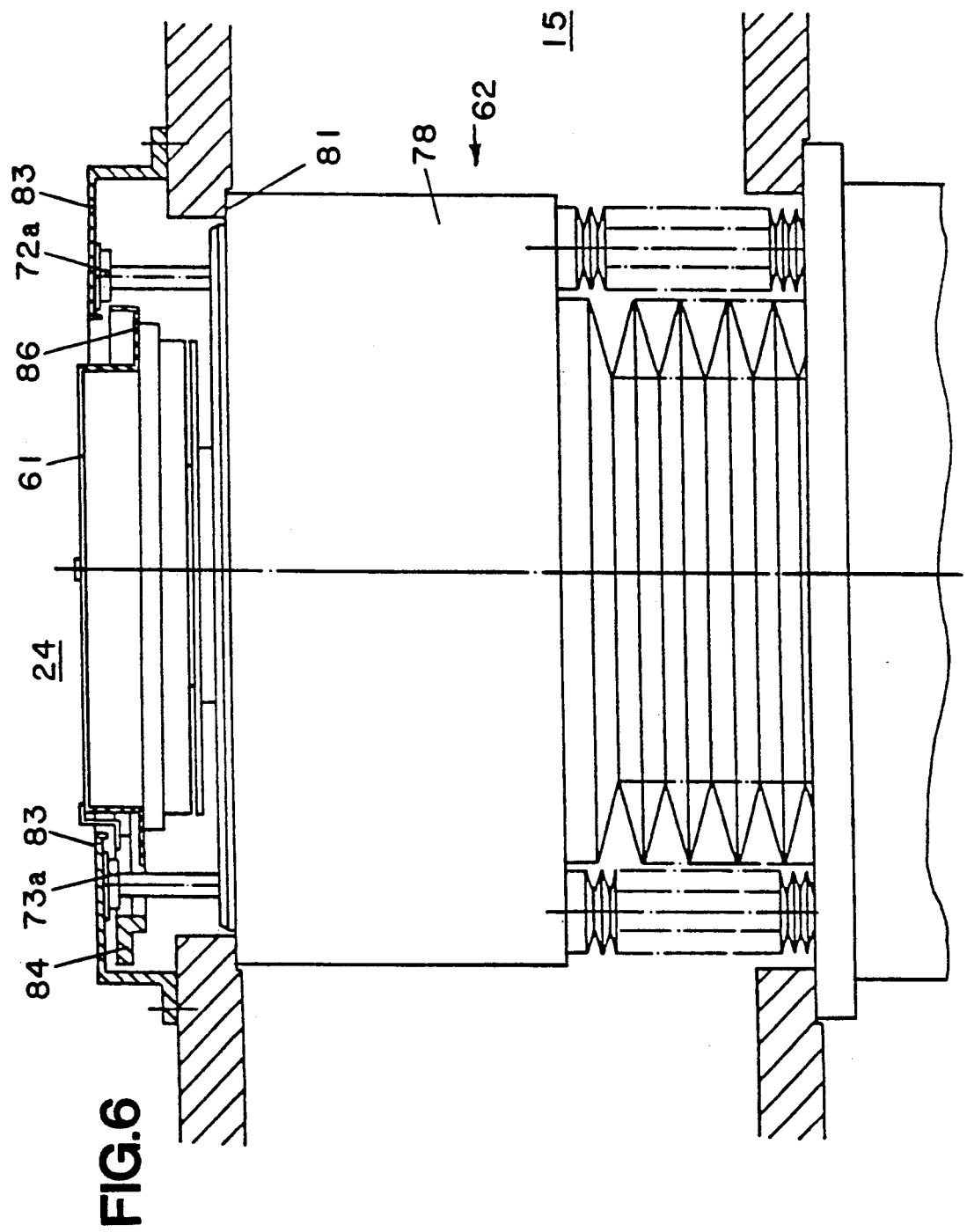
FIG. 6 illustrates the elevating table of FIG. 4 in its final position during the treating of the disk in the treatment chamber.

In FIG. 5 the workpiece support 62 is illustrated in a position risen into an intermediate station. Thereby the workpiece 61 resting on the support has lifted somewhat and the ring hangs by means of its hooks 85 on the edge of the workpiece such that latter is pressed against the heating plate 64 and is secured against a lateral sliding away. The ring acts thereby also as a dead weight loading in order to act against the earlier mentioned gas cushion between the workpiece and the heating plate. This ring 84 has the further duty of covering the annular gap present between the cover 83 and the workpiece which has been risen on the support in order to protect the parts located thereunder from the influence of the treatment taking place in the treatment chamber. In FIG. 5 the mounting members 72 and 73 are illustrated in a position remote from the mounting position, i.e. pivoted toward the outside The workpiece support 62 is illustrated in FIG. 6 risen up into its end position and is located at the treatment position. This position is reached when the cylindrical outer member 78 of the support 62 has been moved onto the edge of the wall 80 of the chamber 15 which is shaped as valve seal 81. The workpiece 61 projects then over the cover 83 and is fully exposed to the treatment in the treatment chamber 24. The mounting members 72 and 73 are pressed at the lower side against the cover 83 where they are slid inwards against the action of the spring 77. In this position under the cover 83 these mounting members 72 and 73 are protected from the influences of the treatment of the workpieces.

In FIG. 6 different embodiments are illustrated at the right hand side and the left hand side and the movable ring 84 is only visible at the left hand side. A annular shield 86 is illustrated in the right hand side of this figure which shield 86 is mounted to the support 62 and covers the annular gap between the cover 83 and the workpiece in order to protect the part located there below from the influences of the treatment chamber. This shield in the shape of a groove must receive during coating treatments the coatings which grow slowly, e.g. an aluminum layer which can be as thick a 7 millimeters. Such coatings can also grow on the cover 83 for which reason this cover is easily exchangeable and accessible from the treatment chamber 24, which is also true for the loose ring 84 and the shield 86. The right hand side of FIG. 6 illustrates a possible embodiment having only one workpiece supporting plate, i.e. without a heating plate.

FIG. 7 illustrates a top view of the loose ring 84 with the hooks 85 located at its inner edge as well as the mounting members 72 and 73 for acting together with the disk shaped workpiece 61 illustrated with broken lines. In other words, the direction of view originates at the treatment chamber 24 when the cover 83 is removed. FIG. 7 illustrates the position after the workpiece support 62 has reached the intermediate position according to FIG. 5 but before the pivoting movement of the mounting members 72 and 73 towards the outside. In other words, the illustration according to FIG. 7 is identical to the situation of the loading position according to FIG. 4 after the mounting members have been pivoted toward the inside if one imagines the loose ring 84 of FIG. 4 to lie in a plane above the workpiece 61 and the mounting members. The two situations mentioned before repeat themselves during the transporting of the workpiece from the treating position back into the loading position. Twice during every treatment cycle with a to and from transport, namely always during the pivoting movement of the mounting members 72 and 73 towards the inside into the position in accordance with FIG. 7 the orientation of the workpiece is corrected. Thereby, the two mounting members 72 are pivoted initially around axes 87 extending parallel to the center axis and not particularly illustrated in FIG. 4 and pressed firmly against a mechanical abutment. The mounting member 73 is thereafter pivoted inwards around the axis 74 also illustrated in FIG. 4. The mounting member presses the workpiece 61 with the edge of the segment 61a (or the flat) softly against the two mounting members 72 and corrects thereby the orientation of the workpieces if the mounting members 72 are not contacted at the same time by the segment edge 61a, i.e. if the mounting members 72 and this edge 61a have not been oriented beforehand parallel. A shifting of the workpiece in the direction against the axis 88 during the procedure of correcting the orientation can be limited in both positions, namely in the loading position by the here not described means for transporting the workpiece from one to the other station and in the intermediate station by the loose ring 84 or parts mounted thereto.

While there is shown and illustrated a present preferred embodiment of the invention it is to be distinctly understood that the invention is not limited thereto, but may be otherwise variously embodied and practiced within the scope of the claims.

I claim:

1. A workpiece support for supporting a disc-shaped workpiece in a vacuum chamber wherein said workpiece is treated by a vacuum based process, the support comprising:
    a support member having a support surface for supporting a surface of the workpiece, said support member having a plurality of bores therethrough, said bores being distributed over said support surface and across a full radial extent of said support surface, and having first ends opening at said support surface;
    means defining a distribution chamber which is substantially co-extensive with said support surfaces, said distribution chamber being spaced from said support surface and said bores having second ends opening into said distribution chamber;
    means for actively changing the temperature of said support member;
    means defining a gas feed to said distribution chamber; and
    said plurality of bores having respective diameters substantially shorter than their respective extents from said distribution chamber to said support surface so as to provide for a distributed feed of gas at said first ends of said bores and between said support surface and the surface of the workpiece to act as a heat transfer medium substantially independently from respective starting positions for gas flow from said distribution chamber at said second ends of said bores.

2. The support of claim 1, wherein said bores each have equal diameters.

3. The support of claim 1, wherein said bores each have equal lengths in said support member.

4. The support of claim 1, wherein said bores are substantially vertical to said support surface and between said distribution chamber and said support surface.

5. The support of claim 1, further comprising heating means for heating said support member.

6. The support of claim 1, further comprising cooling means for cooling said support member.

7. The support of claim 1, further comprising holding means for holding the disc-shaped workpiece at the support surface when gas is supplied between the workpiece and the support surface.

8. The support of claim 1, wherein said bores are evenly distributed over said support member.

9. A workpiece support for supporting a disc-shaped workpiece in a vacuum chamber wherein said workpiece is treated by a vacuum based process, the support comprising:
    a support member having a support surface for supporting a surface of the workpiece, said support member having a plurality of bores therethrough, said bores being distributed over said support surface and having first ends opening at said support surface;
    means defining a distribution chamber which is substantially co-extensive with said support surfaces, said distribution chamber being spaced from said support surface and said bores having second ends opening into said distribution chamber;
    means defining a gas feed to said distribution chamber;
    said plurality of bores having respective diameters substantially shorter than their respective extents from said distribution chamber to said support surface so as to provide for a distributed feed of gas at said first ends of said bores and between said support surface and the surface of the workpiece to act as a heat transfer medium substantially independently from respective starting positions for gas flow from said distribution chamber at said second ends of said bores; and said support member having a lower surface, said support surface comprising an upper surface of said support member, said means defining said distribution chamber comprising a flange connected to said support member and extending over said lower surface of said support member, a first wall defining a lower boundary of an intermediate chamber for receiving said support member, a second wall spaced vertically above said first wall and defining an upper boundary of said intermediate chamber, said second wall having an opening therethrough large enough to receive said support member, elevating means connected to said support member for elevating said support member through said opening of said second wall, and means defining a treatment chamber above said second wall, said support member being movable by said elevating means from said intermediate chamber into said treatment chamber.

10. The support of claim 9, including holding means mounted for movement with respect to said support member, for holding a disk-shaped workpiece at the support surface when gas is supplied between the workpiece and the support surface.

11. The support of claim 10, including an annular cover connected to an upper surface of said second wall and extending around said opening of said second wall, said holding means being engagable against an inner surface of said annular cover for protecting said holding means when said support member is in said treatment chamber.

12. The support of claim 11, including a cylindrical outer member connected to said elevating means and extending around said support member, said outer member having an upper seal, said second wall having a lower valve seat extending around said opening of said second wall against which said seal is engagable when said elevating means raises said support member and said outer member, for sealing said intermediate chamber from said treatment chamber.

13. A workpiece support for supporting a disc-shaped workpiece in a vacuum chamber wherein said workpiece is treated by a vacuum based process, the support comprising:
 a support member having a support surface for supporting a surface of the workpiece, said support member having a plurality of bores therethrough, said bores being distributed over said support surface and having first ends opening at said support surface;
 means defining a distribution chamber which is substantially co-extensive with said support surfaces, said distribution chamber being spaced from said support surface and said bores having second ends opening into said distribution chamber;
 means defining a gas feed to said distribution chamber;
 said plurality of bores having respective diameters substantially shorter than their respective extents from said distribution chamber to said support surface so as to provide for a distributed feed of gas at said first ends of said bores and between said support surface and the surface of the workpiece to act as a heat transfer medium substantially independently from respective starting positions for gas flow from said distribution chamber at said second ends of said bores; and
 a cylindrical outer member operatively connected to said support embmer, elevating means connected to said support member and to said outer member for raising said support member and said outer member, a wall having an opening therein large enough to receive said support member and separating an intermediate chamber from a treatment chamber, said elevating means operating to move said support member from said intermediate chamber into said treatment chamber and to engage said outer member against said wall for sealing said intermediate chamber from said treatment chamber.

14. The support of claim 13, including a ring engaged on said wall and extending around said opening, a plurality of hooks connected to said ring at locations for engaging around said support surface, said elevating means raising said support surface with a workpiece thereon, to engage said hooks on the workpiece, said elevating means functioning to raise said support member by an amount to lift said ring upwardly from said wall so that said hooks press downwardly on the workpiece due to the weight of said ring.

15. A workpiece support for supporting a disc-shaped workpiece in a vacuum chamber wherein said workpiece is treated by a vacuum based process, the support comprising:
 a support member having a support surface for supporting a surface of the workpiece, said support member having a plurality of bores therethrough, said bores being distributed over said support surface and having first ends opening at said support surface;
 means defining a distribution chamber which is substantially co-extensive with said support surfaces, said distribution chamber being spaced from said support surface and said bores having second ends opening into said distribution chamber;
 means defining a gas feed to said distribution chamber;
 said plurality of bores having respective diameters substantially shorter than their respective extents from said distribution chamber to said support surface so as to provide for a distributed feed of gas at said first ends of said bores and between said support surface and the surface of the workpiece to act as a heat transfer medium substantially independently from respective starting positions for gas flow from said distribution chamber at said second ends of said bores; and
 a wall separating an intermediate chamber from a treatment chamber, elevating means connected to said support member for moving said support member vertically from said intermediate chamber through an opening in said wall into said treatment chamber, and a carrier mounted for rotation about an axis extending parallel to the direction of movement of said elevating means, for moving a workpiece over said support member and in said intermediate chamber, said elevating means raising said support surface to engage the workpiece held by said carrier and further move the workpiece vertically from said carrier into said treatment chamber.

* * * * *